United States Patent [19]

Lagnado

[11] 4,032,767

[45] June 28, 1977

[54] HIGH-FREQUENCY CCD ADDER AND MULTIPLIER

[75] Inventor: Isaac Lagnado, San Diego, Calif.

[73] Assignee: The United States of America as represented by the Secretary of the Navy, Washington, D.C.

[22] Filed: Feb. 26, 1976

[21] Appl. No.: 661,689

[52] U.S. Cl. ................................ 364/862; 364/841; 307/221 C; 307/221 D; 357/24

[51] Int. Cl.² ..................... G06G 7/16; H03K 5/159

[58] Field of Search ........... 235/193, 194; 328/160, 328/167; 307/221 D, 221 C, 304; 357/24

[56] References Cited

UNITED STATES PATENTS

| | | | |
|---|---|---|---|
| 3,809,923 | 5/1974 | Esser | 307/221 D |
| 3,931,510 | 1/1976 | Kmetz | 235/193 |
| 3,935,439 | 1/1976 | Buss et al. | 307/221 D X |
| 3,952,188 | 4/1976 | Sloate et al. | 235/193 |
| 3,956,624 | 5/1976 | Audaire et al. | 235/193 X |

*Primary Examiner*—Joseph F. Ruggiero
*Attorney, Agent, or Firm*—R. S. Sciascia; G. J. Rubens; H. Fendelman

[57] ABSTRACT

A device for implementing the arithmetic operations of addition and multiplication utilizing CCD concepts and MOSFET properties. First and second CCD channels convert first and second input voltages into first and second charge quantities, respectively. The first and second charge quantities are added in a third CCD channel to provide a third charge quantity linearly proportional to the sum of the first and second input voltages. The three charge quantities are sensed by three floating gate amplifiers operated in the saturation region. The outputs of the floating gate amplifiers are subsequently combined by a differential amplifier, the output of which is linearly proportional to the product of the first and second input voltages.

13 Claims, 6 Drawing Figures

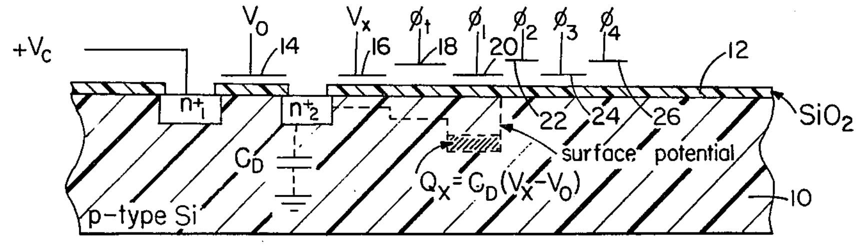
PRIOR ART FIG. 1
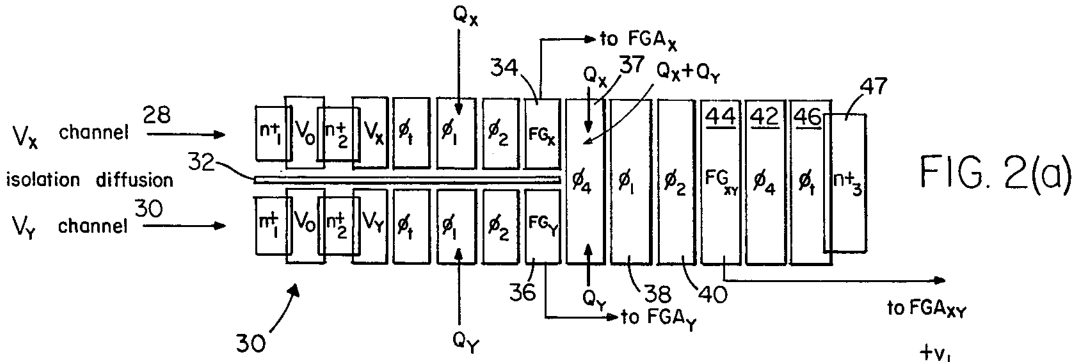
FIG. 2(a)
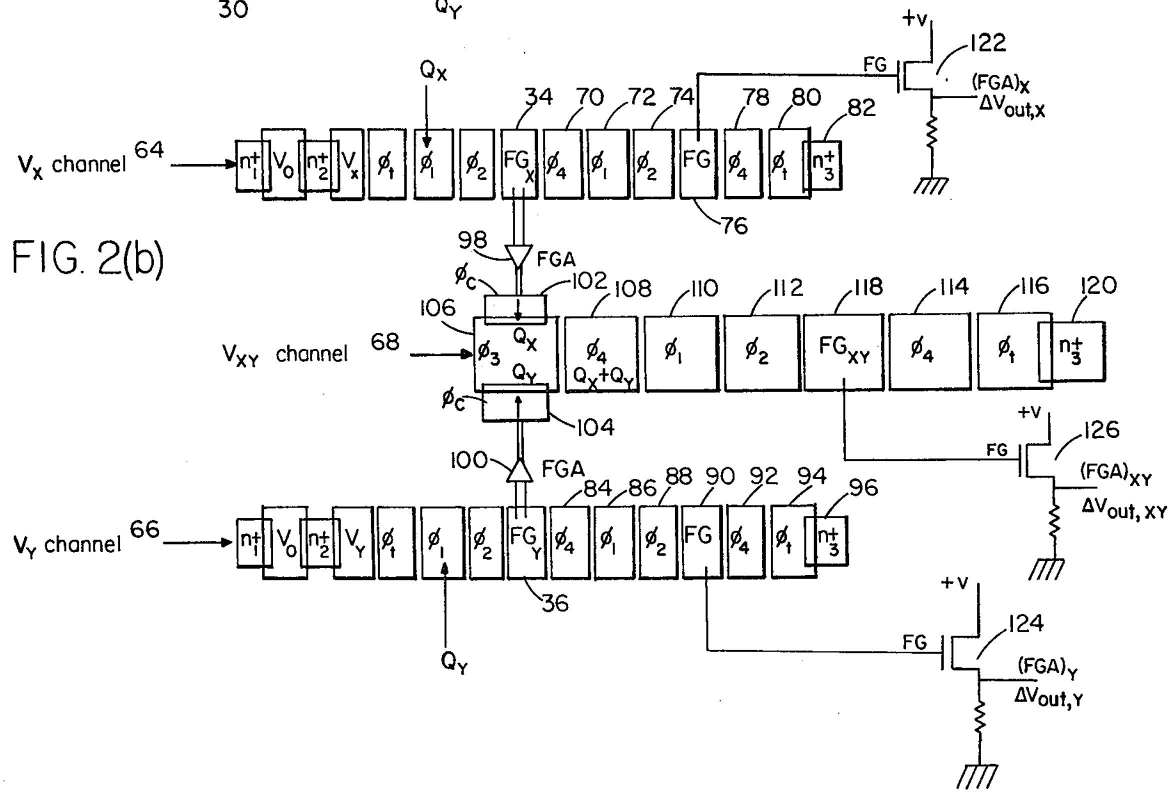
FIG. 2(b)

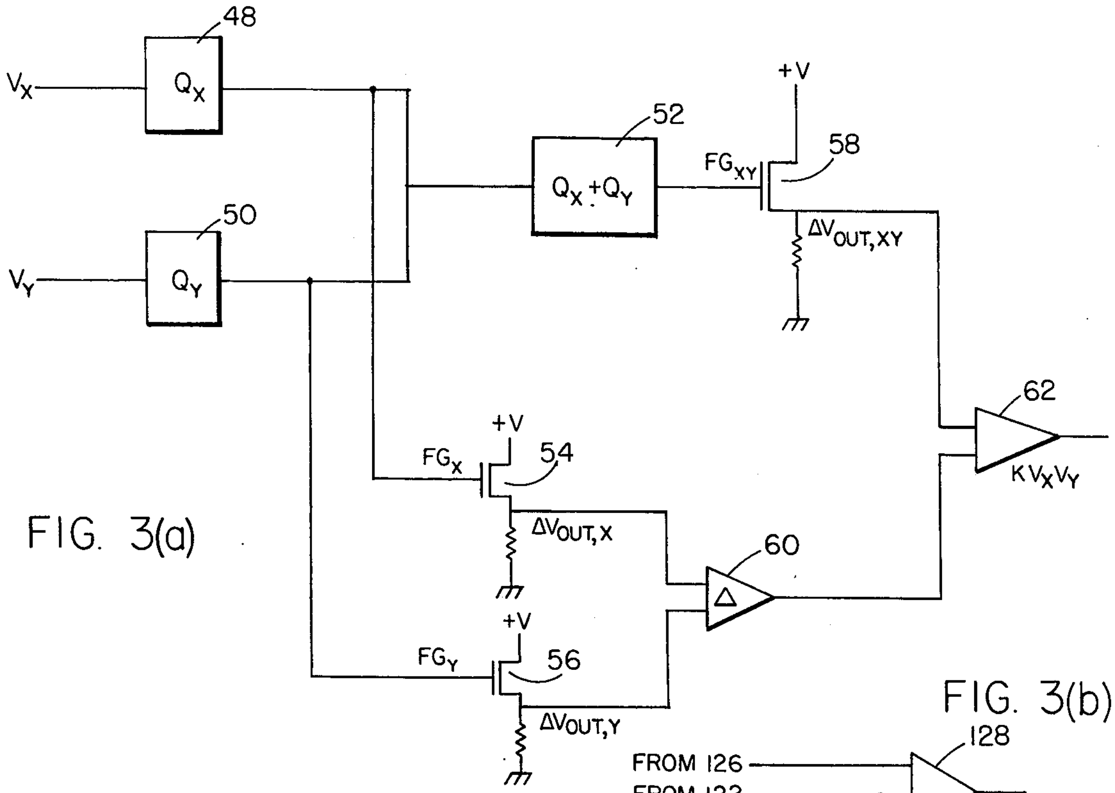
FIG. 3(a)
FIG. 3(b)
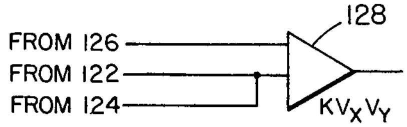

HIGH-FREQUENCY CCD ADDER AND MULTIPLIER

BACKGROUND OF THE INVENTION

The present invention relates generally to the field of adders and multipliers. Previously, high-frequency multipliers have used bipolar transistors. However, the precision of the product is limited by the matching of the transistors and in particular by the precision of the emitter-base junctions which are very sensitive to temperature variations. This problem is compounded by the fact that bipolar transistors dissipate substantial power which is a prime factor in the increase of junction temperature. In order to alleviate the problem of transistor matching, the more recent solutions have used the "integration" approach, i.e., the fabrication of a full multiplication function within a single substrate of silicon. However, due to the parasitic capacitances inherent to the latter technique, the high-frequency properties of bipolar transistors were drastically degraded.

Other attempts to provide suitable multipliers have involved the use of MOSFETS. These also have been unsuccessful due to the low frequency response of the whole multiplier which is typically below 100 KHz.

Presently, the implementation of the multiplication function is achieved by hybrid techniques with the use of accurately matched discrete devices provided in a 2 inches × 1 inch × ½ inch package. These devices, however, have the serious disadvantage of appreciable power dissipation.

SUMMARY OF THE INVENTION

The present invention is related to a novel CCD structure for providing a charge summation from two separate CCD channels in a third CCD channel. This novel CCD structure is combined with field effect MOS transistors (MOSFETS) in a single, silicon substrate to perform the arithmetic operation of multiplication needed in information processing in the implementation of such algorithms as the Fast Fourier Transform (FFT) or Chirp-Z Transform (CZT) with filters, correlators and convolvers. The present invention also finds use in the design and implementation of programmable (variable tap weights) transversal filters.

Basically, the manipulation of information signals to be multiplied and their transformation from a signal voltage to a "charge packet" representation constitutes the principle of the present invention. This transformation ultimately reduces the frequency and accuracy constraints limiting previous approaches. Since the present invention is based on charge transfer, immediate integration of the arithmetic function is naturally exploited to reduce hardware complexity, cost and improve performance and reliability. The availability of the direct interaction of the signal in its "charge packet" representation allows in situ integration of complex signal processing functions on one LSI chip.

This invention simplifies hardware interface and system mechanization thus improving performance and reliability. In effect, the invention reduces the inefficiency associated with surrounding the "signal processor chip" with MSI chips or hybrids to provide these important arithmetic operations.

Since the present invention utilizes floating gate amplifiers which are low-noise amplifiers, the noise component at the output is minimized thus reducing the uncertainty in the measurement values. Moreover, the use of floating gate amplifiers results in an increase in the dynamic range of the multiplier since the dynamic range of the floating gate amplifier is larger than that of a simple MOS transistor.

STATEMENT OF THE OBJECTS OF THE INVENTION

Accordingly, it is the primary object of the present invention to disclose the first implementation of the arithmetic function of multiplication in CCD technology.

It is a further object of the present invention to disclose a novel multiplier which improves the frequency response and accuracy over previous approaches.

It is a further object of the present invention to disclose a multiplier that improves performance and reduces the cost of complex signal processors utilized in information processing.

It is a still further object of the present invention to disclose a novel CCD adder.

It is a still further object of the present invention to disclose a novel CCD register.

It is yet another object of the present invention to disclose a multiplier constructed with MOS and CCD technologies, thus providing commonality in materials technology and permitting fabrication on one silicon substrate, eliminating interfaces with their attendant problems.

Other objects, advantages and novel features of the invention will become apparent from the following detailed description of the invention when considered in conjunction with the accompanying drawings.

BRIEF DESCRIPTION OF THE DRAWINGS

FIG. 1 is a cross-sectional view of a prior art stabilized gated diode.

FIG. 2*a* is a top view of a first embodiment of the CCD portion of the present invention.

FIG. 2*b* is a top view of a second embodiment of the multiplier of the present invention illustrating the connections to the floating gate amplifiers thereof.

FIG. 3*a* is a schematic block diagram of the multiplier of the present invention illustrating the connections of the output floating gate amplifiers for forming the product of the input voltages FIG. 3*b* is a block diagram of the output portion of the multiplier according to the present invention for use with the implementation illustrated in FIG. 2*b*.

DESCRIPTION OF THE PREFERRED EMBODIMENTS

Figure 4:
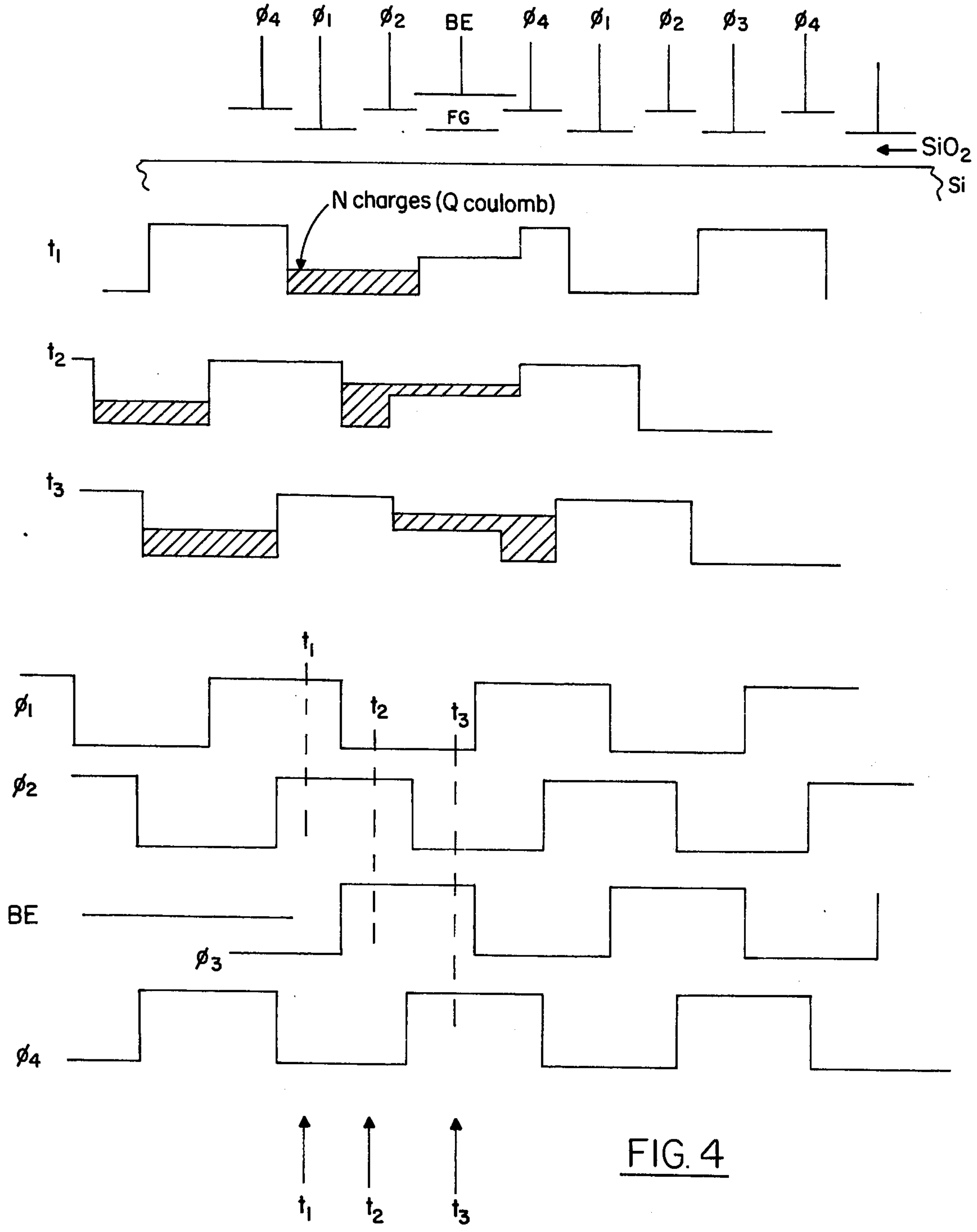
FIG. 4 is a timing diagram showing the proper timing relationship between the clock phases and floating gate electrodes for a four-phase clocking scheme for operation of the present invention juxtapose to a "charge packet" propagation representation of a partial cross-section of the FIG. 2*a* embodiment.

In order to facilitate an understanding of the present invention, a brief description of the stabilized gated diode and the equations therefore in addition to the equations relating the drain current and gate voltage of a MOSFET transistor will be given.

Referring now to FIG. 1, there is illustrated a cross-sectional view of a stabilized gated diode CCD structure. The structure comprises a p-type silicon (Si) substrate 10 with a layer 12 of silicon dioxide ($SiO_2$) disposed thereon. An input diode $n_1^+$ is formed in the substrate and is connected to the control voltage $V_c$. A first transfer electrode 14 is formed on the layer 12 and is connected to the pulsed voltage supply $V_O$. A second transfer electrode 16 is formed on the layer 12 and is connected to the input signal voltage $V_X$. A floating diffusion $n_2^+$ is formed in the substrate 10 as illustrated between the electrodes 14 and 16. $C_D$ represents the depletion layer capacitance. $\phi_t$ is the transfer gate voltage and is connected to electrode 18. Electrodes 20, 22, 24 and 26 are connected to the phases $\phi_1$, $\phi_2$, $\phi_3$ and $\phi_4$, respectively, of a four phase clocking scheme.

The operation of this device is well known and is described in the article "Noise Measurements on the Floating Diffusion Input for Charge-Coupled Devices" by S. P. Emmons and D. D. Buss in the Journal of Applied Physics, Volume 45, No. 12, December 1974, pages 5303–5306 incorporated herein by reference. Briefly, a predetermined amount of charges are injected into the device by applying the voltage $V_O$. When the input voltage $V_X$ is applied a quantity of charges proportional to $V_X$ are transferred along the device according to the relationship $$Q_X = C_D (V_X - V_O). \qquad (1)$$

The charge packet is moved down the device by proper phasing of the clock electrodes as is well known.

The equation relating drain current and gate voltage of a MOSFET transistor in the saturation region is quadratic and may be written as follows:

$$I_D = K (V_G - V_T)^2 \text{ for the case } V_{DS} \geq V_G - V_T \qquad (2)$$

where $I_D$ is the drain-source current, $V_G$ is the gate voltage, $V_T$, a constant, is the threshold voltage, K is a device parameter which is dependent on channel carrier mobility, gate capacitance and physical device dimensions, and $V_{DS}$ is the drain-source D.C. voltage.

The present invention is based on the simplicity of charge summation using the charge transfer concept. The basic equation (2) is used to illustrate the mechanics of the invention. It is assumed that the two quantities $V_X$ and $V_Y$ are applied to the gates of two separate MOS transistors. The resulting current from each device is:

$$I_X = K (V_X - V_t)^2 \qquad (3)$$

$$I_Y = K (V_Y - V_T)^2. \qquad (4)$$

When applying to the gate of a third MOS transistor a voltage equal to the sum of $V_X$ and $V_Y$, the source drain current is represented by the equation:

$$I_{XY} = K (V_X + V_Y - V_T)^2 = K (V_X^2 - 2V_X V_T + V_T^2) + (V_Y^2 - 2V_Y V_T + V_T^2) - V_T^2 + 2V_X V_Y = K (I_X + I_Y - I_T) + 2K V_X V_Y. \qquad (5)$$

From this it follows that $$2K V_X V_Y = I_{XY} - K [I_X + I_Y - I_T]. \qquad (6)$$

From the above equation (6) it is seen that the product $V_X V_Y$ is linearly proportional to the difference between the quantity $I_{XY}$ and the sum of the quantities $I_X$ and $I_Y$, since $I_T$ is a constant.

The present invention comprises implementation of the above equation (6) in a novel device structure. This is accomplished by performing a voltage-to-charge conversion for each of the input voltages $V_X$ and $V_Y$, i.e., $V_X$ is converted into the charge quantity $Q_X$ and the voltage $V_Y$ is converted into the charge quantity $Q_Y$ by the CCD structure described below which achieves this conversion with a direct proportionality between the voltages and charges. The charge quantities $Q_X$ and $Q_Y$ are summed in the CCD structure to provide a third charge quantity $Q_X + Q_Y$ necessary for solution of the above equation (6).

Referring now to FIG. 2*a*, there is illustrated a first embodiment of the CCD structure for converting the input voltages $V_X$ and $V_Y$ into the charge quantities $Q_X$ and $Q_Y$ and for summing the charge quantities to provide the third charge quantity $Q_X + Q_Y$. The device is comprised of a $V_X$ channel 28 and a $V_Y$ channel 30 separated by isolaton diffusion 32. The channels 28 and 30 are identical to the stabilized gated diode illustrated in FIG. 1 with the charge quantities $Q_X$ and $Q_Y$ being developed under the $\phi_1$ electrodes in each channel. The third phase electrode, $\phi_3$, however, is replaced by floating gates 34 and 36 and bias electrodes formed thereover with a layer of $SiO_2$ dielectric therebetween (not shown) in the X and Y channels, respectively. Adjacent the floating gates 34 and 36 is the $\phi_4$ clock electrode 37 under which the charges $Q_X$ and $Q_Y$ are accumulated and summed. The remaining portion of the device comprises the clock electrodes 38, 40, and 42 corresponding respectively to the clock phases $\phi_1$, $\phi_2$, $\phi_4$ as well as the floating gate 44, the transfer gate 46 and the output diode 47 ($n_3^+$).

In order to complete the multiplication process, each of the floating gates 34, 36 and 44 are coupled to one of the floating gates of three source-follower amplifiers. This connection is illustrated in FIG. 3*a* wherein the block 48 represents the $Q_X$ channel, the block 50 represents the $Q_Y$ channel and the block 52 represents the $Q_X + Q_Y$ channel. Thus, the floating gate 34 is coupled to the floating gate of the source-follower MOSFET 54. Similarly, the floating gate 36 is coupled to the floating gate of the source-follower MOSFET 56. Likewise, the floating gate 44 is coupled to the floating gate of source-follower MOSFET 58. Each of the source-follower transistors 54, 56 and 58 are provided with load resistances R and bias supply voltages +V. The source outputs of the source-follower transistors 54 and 56 are inputted to a delay device 60 which may comprise, for example, an operational aplifier, which provides a delay equal to one bit-time such that the outputs of all three source-follower transistors 54, 56 and 58 appear at the input to the differential amplifier 62 at precisely the same time. This delay is necessary in order to compensate for the time it takes the charge packet $Q_X + Q_Y$ to shift along the CCD channel from the floating gate electrodes 34 and 36 to the floating gate electrode 44 in FIG. 2*a*.

The device thus far described operates as follows. Each of the three charge quantities $Q_X$, $Q_Y$, and $Q_X + _{QY}$ is separately sensed by its respective floating gate 34, 36 and 44 which, structurally, are extended in the semiconductor to also function as the floating gates of the source-follower transistors 54, 56 and 58, respectively. These floating gates control the drain-source current of their respective source-follower transistors. The charge quantities to be sensed are brought under their respective floating gates by manipulation of the potentials of the adjacent charge coupling electrodes according to the timing diagram, "charge packet" propagation representation and partial side view illustrated in FIG. 4. BE is the D.C. potential on the bias electrode of the floating gate. These signal charges can electrostatically produce a change on the potential of the floating gate. It is noted that the floating gate provides a capacitive link between the signal electron in the CCD channel and the channel current of the MOS transistor without physically making contact through either of them. The signal electrons are still isolated and may be moved downstream in the signal channel in the standard CCD fashion. It is therefore possible to use the same signal charge in successive stages of similar structure. As charges in the CCD channel move under the floating gate electrodes, the voltage on that floating gate varies. The potential of the floating gate is lowered by a voltage $\Delta V_{FG}$ proportional to the number of charges passing under this floating gate. The variation $\Delta V_{FG}$ is translated into a change in current $\Delta I$ resulting in an output voltage change $\Delta V_{out}$. This relationship is expressed by the following equation:

$$\Delta V_{out} = R\Delta I = A\ V_{i,X} = A\ R_s\ Q_X \quad (7)$$

where A is the gain of the source-follower and is equal to $G_mR/l + G_mR$, $R_s$ is the floating gate responsivity, $G_m$ is the transistor transconductance and $R$ is the source load resistance.

To recapitulate the operation of the device, it is seen that the input voltages, $V_X$ and $V_Y$, are converted by the CCD device into the charge quantity $Q_X$, $Q_Y$ and $Q_X + Q_Y$. These charges vary the potentials on the floating gates of the source-follower transistors and are thus converted back into the output voltages $\Delta V_{O,X}\Delta V_{O,Y}$, and $\Delta V_{O,XY}$, i.e., into $I_X$, $I_Y$ and $I_{XY}$. The effect of the differential amplifier 62 is to subtract from the quantity $I_{XY}$, the sum $I_X + I_Y$, i.e., the output of 62 is $$I_{XY} - [I_X + I_Y]. \quad (8)$$

Comparing this with equation (6) it is noted that the output of the differential amplifier 62 is linearly proportional to the quantity $V_X V_Y$, the quantities 2, K, and $I_T$ being constants.

As an alternative embodiment the device illustrated in FIG. 2*b* may also be utilized. It is observed therein that a separate $V_X$ CCD channel 64 is provided as well as a $V_Y$ CCD channel 66 and a $V_{XY}$ CCD channel 68. Each of the channels is separated by an isolation diffusion (not shown). The $V_X$ channel 64 and the $V_Y$ channel 66 are identical to the like channels in FIG. 2*a* up to the point of the floating gates 34 and 36. In this embodiment, however, separate CCD registers are used to provide the one bit delay function introduced by delay device 60 illustrated in FIG. 3*a*. In the $V_X$ channel 64 separate $\phi_4$, $\phi_1$ and $\phi_2$ clock phase electrodes 70, 72 and 74, respectively, are used as well as a separate floating gate 76, $\phi_4$ clock phase electrode 78 and $\phi_t$ transfer gate electrode 80. A separate output diode 82 is also used to complete the channel. Similarly, the $V_Y$ channel 66 includes clock phase electrodes 84, 86 and 88 as well as floating gate 90, clock phase electrode 92, transfer gate electrode 94 and output diode (sink) 96. A floating gate amplifier (charge amplifier) 98 couples the $V_X$ channel 64 floating gate 34 to the $V_{XY}$ channel 68. Similarly, a floating gate amplifier 10 couples the $V_Y$ channel 66 floating gate 36 to the $V_{XY}$ channel 68. Control gates ($\phi_c$) 102 and 104 permit the charges to be transferred from the charge amplifiers 98 and 100 to the CCD channel 68.

The CCD channel 68 is comprised of the clock phase electrodes $\phi_3$, $\phi_4$, $\phi_1$, $\phi_2$, $\phi_4$ and $\phi_t$ (106, 108, 110, 112, 114, and 116) as well as the floating gate 118 and its bias electrode (BE) positioned on top of it and separated therefrom by a layer of $SiO_2$ dielectric (not shown) and the output diode 129 ($n_3^+$). The floating gates 76, 90 and 118 are formed as extensions of the floating gates of the source-follower transistors 122, 124 and 126, respectively.

Referring to FIG. 3*b*, the connections of the outputs of the source-follower transistors 122, 124 and 126 are illustrated as connected to the inputs of the differential amplifier 128. The embodiment of the present invention illustrated in FIGS. 2*b* and 3*b* operates in substantially the same manner as the FIG. 2*a* and 3*a* embodiment, the difference being that the one bit delay introduced by delay device 60 in FIG. 3*a* is introduced by the CCD channels 64 and 66. Thus, a one bit delay occurs in the $V_X$ channel 64 between the floating gates 34 and 76 and, likewise, a one bit delay occurs in the $V_Y$ channel 66 between the floating gate 36 and the floating gate 90. The outputs of the source-follower transistors 122, 124 and 126 thus occur in phase.

In addition to the function of the present invention of multiplication, a portion of the present invention can also function as a linear adder. Referring again to FIG. 2*a* it is observed that the $V_X$ input is converted into a charge quantity $Q_X$ and that the $V_Y$ voltage input is likewise converted into the charge quantity $Q_Y$. These charge quantities $Q_X$ and $Q_Y$ are accumulated under the $\phi_4$ electrode 37. Since, as described above the for X channel $$Q_X = C_{DX}(V_X - V_O) \quad (9)$$

and for the $Y$ channel $$Q_Y = C_{DY}(V_Y - V_O) \quad (10)$$

it follows that $$Q_X + Q_Y = C_{DX}V_X + C_{DY}V_Y - V_O(C_{DX} + C_{DY}). \quad (11)$$

For the output diode $n_3^+$ (47) the following expression holds:

$$Q_X + Q_Y = C_{OD}V \quad (12)$$

where V is the output voltage and $C_{OD}$ is the output diode capacitance. Since the input diode capacitances $C_{DX}$ and $C_{DY}$ are equal, the equation (11) may be rewritten as $$Q_X + Q_Y = C_D(V_X + V_Y) - 2\,V_O C_D = C_D(V_X + V_Y - 2\,V_O). \quad (13)$$

Combining this equation with equation (12) it is observed that $$C_{OD}V = C_D(V_X + V_Y = 2\,V_O).$$

Since the terms $C_{OD}$, $C_D$, and 2 $V_O$ are all constants it is apparent that the output voltage $V$ is linearly proportional to the sum of the input voltages $V_X$ and $V_Y$.

It is thus apparent that a novel monolithic adder and multiplier have been disclosed which have the capability of combining in a single element or chip the addition and/or multiplication functions with other signal processing functions and that these functions can be fabricated with compatible technologies. As an alternative, the device can be modified to include bipolar signals.

Obviously many other variations and modifications of the present invention are possible in the light of the above teachings. It is therefore to be understood tht within the scope of the appended claims the invention may be practiced otherwise than as specifically described.

I claim:

1. A multiplier comprising:
first means for converting an input voltage $V_X$ into a charge quantity $Q_X$;
second means for converting an input voltage $V_Y$ into a charge quantity $Q_Y$;
third means operably coupled to said first and second means for forming the sum of the charge quantities $Q_X + Q_Y$;
fourth means operably coupled to said first means for sensing the charge quantity $Q_X$ and for outputting a voltage $\Delta V_{out}$, X proportional thereto;
fifth means operably coupled to said second means for sensing the charge quantity $Q_Y$ and for outputting a voltage $\Delta V_{out,\ Y}$ proportional thereto;
sixth means operably coupled to said third means for sensing the charge quantity $Q_X + Q_Y$ and for outputting a voltage $\Delta V_{out,\ XY}$ proportional thereto; and
output means operably coupled to said fourth, fifth and sixth means for outputting a voltage equal to K $V_X$ $V_Y$ where K is a constant.

2. The multiplier of claim 1 wherein said first and second means comprise first and second CCD channels, respectively.

3. The multiplier of claim 2 wherein said third means comprises a third CCD channel.

4. The multiplier of claim 3 wherein said fouth, fifth and sixth means comprises first, second and thid source-follower transistors, respectively.

5. The multiplier of claim 4 wherein said first, second and third source-follower transistors are biased in the saturation region.

6. The multiplier of claim 5 wherein said first, second and third source-follower transistors each have a floating gate operably coupled to said first, second and third CCD channels, respectively.

7. The multiplier of claim 6 wherein:
said first CCD channel includes a first floating gate;
said second CCD channel includes a second floating gate;
said first floating gate being coupled to a first floating gate amplifier;
said second floating gate being operably coupled to a second floating gate amplifier; and
said first and second floating gate amplifiers being operably coupled to said third CCD channel.

8. The multiplier of claim 6 wherein said first CCD channel includes a first delay means for delaying the sensing of said charge quantity $Q_X$ by said fourth means for one bit-time and said second CCD channel includes a second delay means for delaying the sensing of said charge quantity $Q_Y$ by said fifth means for one bit-time.

9. The multiplier of claim 8 wherein said first and second delay means comprise CCD channels.

10. The multiplier of claim 9 wherein said output means comprises a differential amplifier having a first input connected to the output of said third source-follower transistor and a second input connected to the outputs of said first and second source-follower transistors.

11. A multiplier comprising:
first means for receiving input voltages $V_X$ and $V_Y$, for converting $V_X$ and $V_Y$ into charge quantities $Q_X$ and $Q_Y$ and for forming the sum $Q_X + Q_Y$; and
second means operably coupled to said first means for receiving said charge quantities $Q_X$, $Q_Y$ and $Q_X + Q_Y$ and for forming the product K $V_X$ $V_Y$ therefrom, where K is a constant.

12. An adder comprising:
a first CCD register portion including a first transfer gate electrode, a first plurality of clock electrodes and a first floating gate disposed thereon;
a second CCD register portion including a second transfer gate, a second plurality of clock electrodes and a second floating gate disposed thereon;
an isolation diffusion located between said first and second CCD registers; and
a third CCD register portion including a third plurality of clock electrodes, one of said third plurality of clock electrodes being located adjacent said first and second floating gates such that the charges accumulated under said first and second floating gates are transferable to said third CCD register portion, whereby the output of said third CCD register portion is linearly proportional to the sum of the outputs of said first and second CCD registers.

13. A charge coupled device adder comprising:
a first CCD register portion including a first transfer gate electrode and a first plurality of clock electrodes disposed on a semiconductor substrate;
a second CCD register portion including a second transfer gate electrode and a second plurality of clock electrodes disposed on said semiconductor substrate;
an isolation diffusion located between said first and second CCD register portions; and
a third CCD register portion including a third plurality of clock electrodes, one of said third plurality of clock electrodes being located adjacent to one of said first plurality of clock electrodes and to one of said second plurality of clock electrodes such that the charges accumulated in said first and second CCD register portions are cumulatively transferable to said third CCD register portion.

* * * * *